United States Patent
Shiromaru et al.

(10) Patent No.: US 6,492,858 B1
(45) Date of Patent: Dec. 10, 2002

(54) SEMICONDUCTOR INTEGRATED CIRCUIT AND METHOD FOR GENERATING A CONTROL SIGNAL THEREFOR

(75) Inventors: Kazunori Shiromaru; Shigekazu Otsuka, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/618,928

(22) Filed: Jul. 18, 2000

(30) Foreign Application Priority Data

Jul. 22, 1999 (JP) ............................................ 11-207569

(51) Int. Cl.[7] .............................. G06F 1/04; H03K 3/50
(52) U.S. Cl. ..................................................... 327/291
(58) Field of Search ............................. 327/18, 19, 24, 327/99, 291–293, 298, 299, 141; 326/93

(56) References Cited

U.S. PATENT DOCUMENTS

| | | | |
|---|---|---|---|
| 5,313,154 A | * 5/1994 | Norris | 324/76.48 |
| 5,623,223 A | * 4/1997 | Pasqualini | 327/298 |
| 5,825,834 A | * 10/1998 | Chambers et al. | 375/360 |
| 5,896,052 A | * 4/1999 | Gujral et al. | 327/144 |
| 5,987,081 A | * 11/1999 | Csoppenszky et al. | 327/354 |
| 6,121,814 A | * 9/2000 | Henry | 327/291 |

FOREIGN PATENT DOCUMENTS

| | | |
|---|---|---|
| JP | 2-7284 | 1/1990 |
| JP | 2-153455 | 6/1990 |
| JP | 2-214348 | 8/1990 |
| JP | 7-56756 | 3/1995 |
| JP | 11-68721 | 3/1999 |

* cited by examiner

Primary Examiner—My-Trang Nu Ton
(74) Attorney, Agent, or Firm—Scully, Scott, Murphy & Presser

(57) ABSTRACT

A semiconductor integrated circuit having a selector 1, which selects either an inverted signal 2B or a non-inverted signal 2A, based on the condition of a read strobe signal RDST that gives an instruction for readout of data in the logic circuit 10 into the read buffer 20, a first flip-flop circuit 2, which latches the signal selected by the selector 1 at the timing of the internal clock signal CK, and outputs the latched signal 2A to the selector 1, a second flip-flop circuit 3, which shifts the output signal 2A of the first flip-flop circuit 2 at the timing of the internal clock signal CK, and an exclusive-OR circuit 4, which takes the exclusive OR of the output signal 2A of the first flip-flop circuit 2 and the output signal 3A of the second flip-flop circuit 3, the output signal of the exclusive-OR circuit 4 serves as a clock signal RCK for readout of the read buffer 20.

3 Claims, 3 Drawing Sheets

US 6,492,858 B1

SEMICONDUCTOR INTEGRATED CIRCUIT AND METHOD FOR GENERATING A CONTROL SIGNAL THEREFOR

BACKGROUND OF THE INVENTION

1. Field of the Invention

The present invention relates to a semiconductor integrated circuit and to a method for generating a control signal therefor.

2. Related Art

FIG. 2(a) is a circuit diagram showing prior art. In this circuit, as shown in FIG. 2(b), a timer counter 10 performs counting operation in synchronization with a counting clock signal CK, a read buffer 20 reading in the value of the timer counter 10 in synchronization with a read clock signal RCK. On the rising edge of the counting clock signal CK, the timer counter 10 performs a counting operation.

A flip-flop 9 captures an inverted read strobe signal RDST, in synchronization with the counting clock signal CK. The output signal 9A of the flip-flop 9 and the counting lock signal CK are input to an AND circuit 30, and on the rising edge of the read clock RCK, which is the output from the AND circuit 30, a read buffer 20 captures the value of the timer counter 10. That is, when the read strobe signal RDST is 0, the read buffer 20 constantly captures the value of the timer counter 10, and when the read strobe signal RDST is 1, the read buffer 20 value is not updated.

As shown in FIG. 2(b), in the case in which the output signal 9A of flip-flop 9 is delayed, the read clock signal RCK rises, resulting in capture of data, and hindrance of the prescribed operation. For this reason, the counting clock signal CK is delayed by a delay circuit 40 provided in the clock line, and the read clock signal RCK is generated, so as to output to a read data bus 50 a properly established value of the read buffer 20.

In this case, however, because of the delay circuit 40, analysis using a static analysis tool becomes difficult.

FIG. 3(a) is an example of another circuit of the prior art, which is disclosed in Japanese Unexamined Patent Publication (KOKAI) No.2-7284.

In this case of this circuit, as shown in FIG. 3(b), if a period of a read strobe signal is shorter than that of one clockφ, a glitch 50 occurs, so that this glitch acts as a read clock, resulting in unwanted data capture at the timing indicated by the arrow, this representing faulty operation.

Accordingly, it is an object of the present invention, in order to improve on the above-noted drawbacks of the prior art, to provide a novel semiconductor integrated circuit and method for generating a control signal therefor, which can be statically analyzed, and wherein faulty operation does not occur even if a period of read strobe signal is shorter than that of one clock.

SUMMARY OF THE INVENTION

In order to achieve the above-noted objects, the present invention has the following basic technical constitution.

Specifically, the first aspect of the present invention is a semiconductor integrated circuit in which data of a logic circuit which operates by an internal clock signal is read into a read buffer, using a readout clock signal that is not synchronized to the internal clock signal, comprising a selector, which selects either an inverted signal or a non-inverted signal, based on the condition of a read strobe signal that gives an instruction for readout of data in the logic circuit into the read buffer, a first flip-flop circuit, which latches a signal selected by the selector at a timing of the internal clock signal, and outputs a latched signal to the selector, a second flip-flop circuit, which shifts an output signal of the first flip-flop circuit at a timing of the internal clock signal, and an exclusive-OR circuit, which takes an exclusive OR of the output signal of the first flip-flop circuit and an output signal of the second flip-flop circuit, an output signal of the exclusive-OR circuit serves as the readout clock signal of the read buffer.

In the second aspect of the present invention, the output signal of the first flip-flop circuit is input to one terminal of the selector, and an inverted signal of the output signal of the first flip-flop circuit is input to another terminal of the selector.

The third aspect of the present invention is a control signal generating method for a semiconductor integrated circuit in which data of a logic circuit which operates by an internal clock signal is read into a read buffer, using a readout clock signal that is not synchronized to said internal clock signal, comprising: a first step of generating a pulse signal that is synchronous with the internal clock signal, when a read strobe signal is not giving an instruction or readout of data in the logic circuit to the read buffer, and of stopping to generate the pulse signal, when the read strobe signal gives an instruction for readout, a second step of shifting the pulse signal generated by the first step by one clock, in synchronization with the internal clock signal, and a third step of taking an exclusive OR of the signal generated by the first step and a signal generated by the second step, and using the resulting signal as the readout clock signal.

BRIEF DESCRIPTIONS OF THE DRAWINGS

DETAILED DESCRIPTION OF THE PREFERRED EMBODIMENTS

An embodiment of a semiconductor integrated circuit and associated method for generating a control signal therefor according to the present invention are described in detail below, with references being made to relevant accompanying drawings.

Figure 1A:
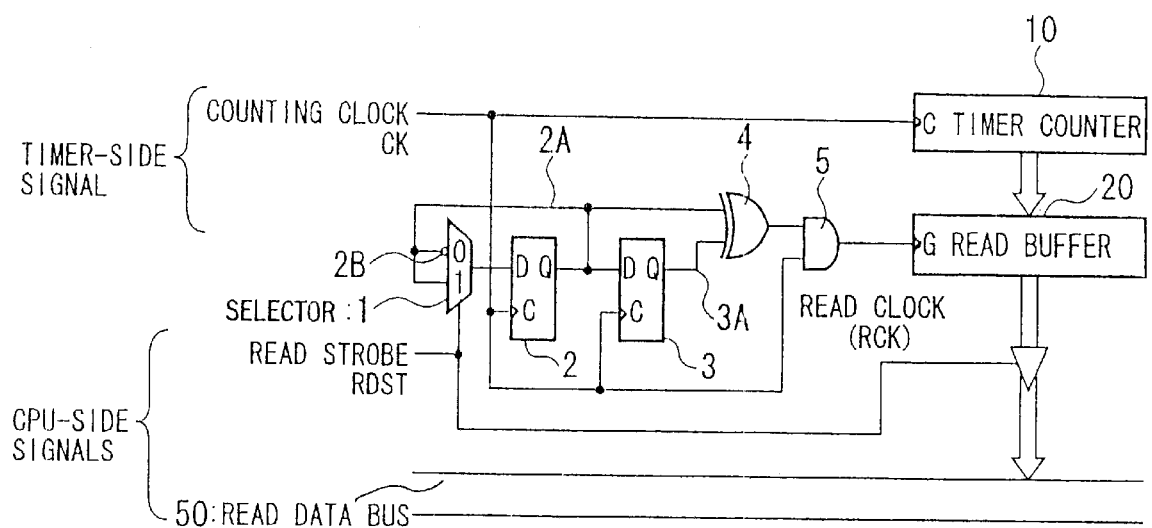
FIG. 1(a) is a circuit diagram of a semiconductor integrated circuit according to the present invention.
Figure 1B:
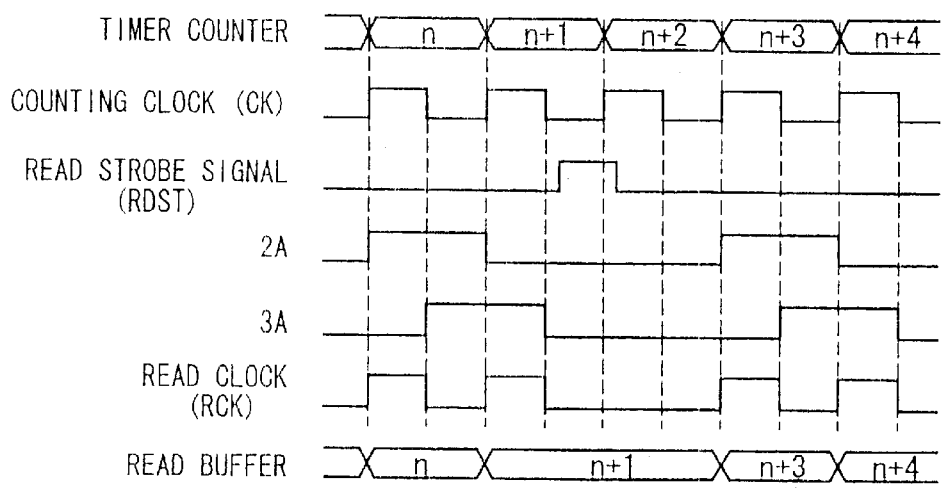
FIG. 1(b) is a timing diagram thereof.
Figure 2A:
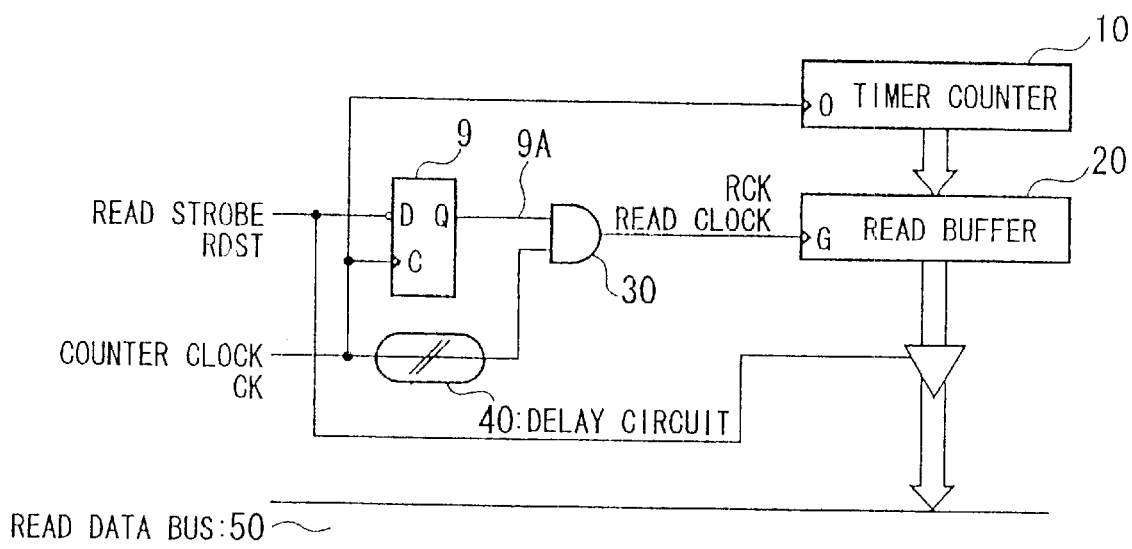
FIG. 2(a) is a circuit diagram of a semiconductor integrated circuit according to the prior art.
Figure 2B:
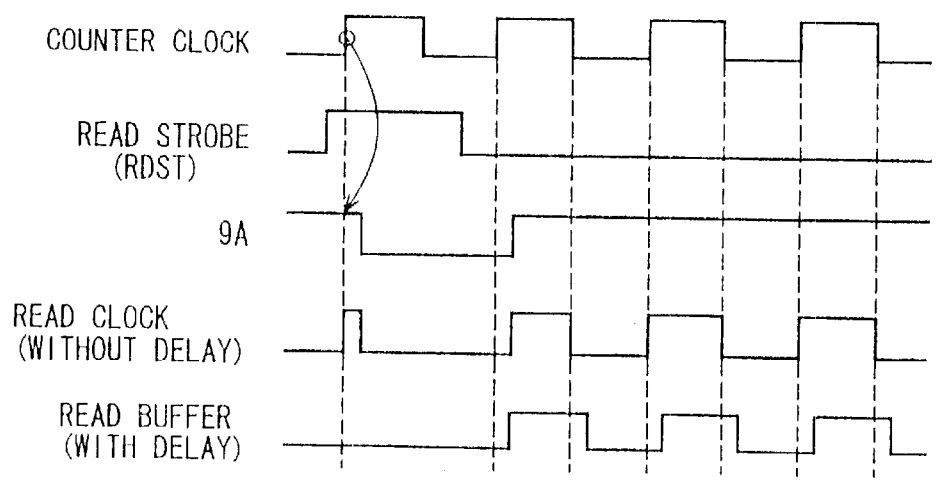
FIG. 2(b) is a timing diagram thereof.
Figure 3A:
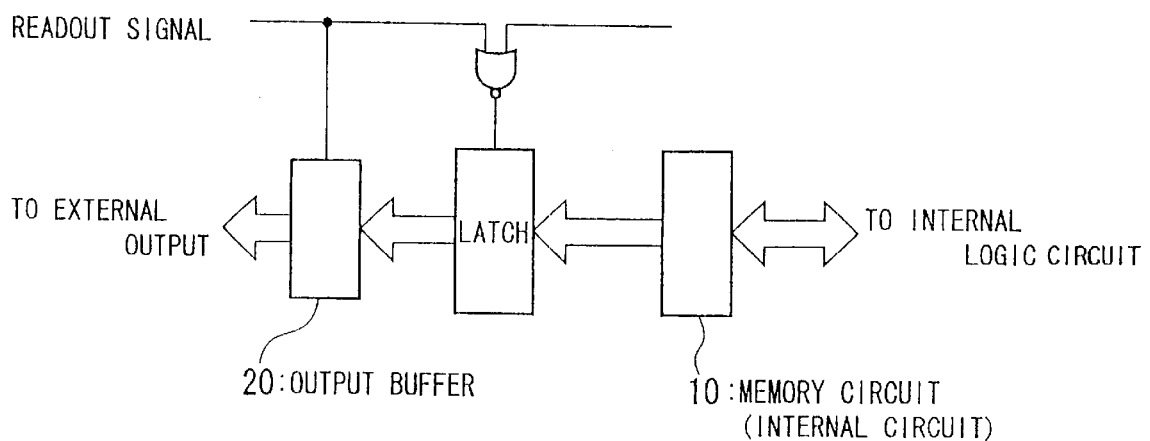
FIG. 3(a) is a circuit diagram of another semiconductor integrated circuit according to the prior art.
Figure 3B:
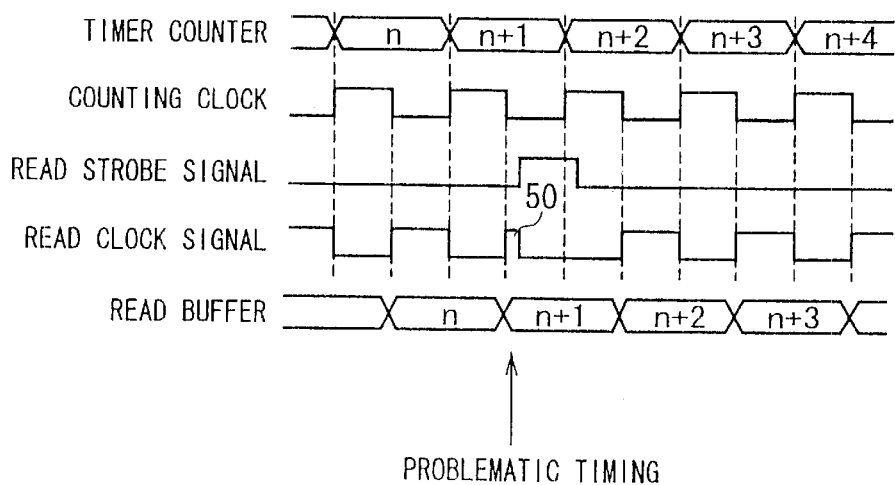
FIG. 3(b) is a timing diagram thereof.

FIG. 1(a) is a circuit diagram of a semiconductor integrated circuit according to the present invention, and FIG. 1(b) is an associated timing diagram.

These drawings illustrate a semiconductor integrated circuit in which data of the logic circuit 10 which operates by a internal clock signal CK is read into a read buffer 20, using a readout signal RDST that is not synchronized to the internal clock signal CK, this semiconductor integrated circuit having a selector 1, which selects either an inverted signal 2B or a non-inverted signal 2A, based on the condition of a read strobe signal RDST that gives an instruction for readout of data in the logic circuit 10 into the read buffer 20, a first flip-flop circuit 2, which latches the signal selected by the selector 1 at the timing of the internal clock signal CK, and outputs the latched signal 2A to the selector 1, a second flip-flop circuit 3, which shifts the output signal 2A of the first flip-flop circuit 2 at the timing of the internal clock signal CK, and an exclusive-OR circuit 4, which takes the exclusive OR of the output signal 2A of the first flip-flop circuit 2 and the output signal 3A of the second flip-flop circuit 3, the output signal of the exclusive-OR circuit 4 serves as a clock signal RCK for readout of the read buffer 20.

The output signal 2A of the first flip-flop circuit 2 is input to one terminal of the selector 1, and the output signal 2A of the first flip-flop circuit 2 is input in the inverted condition to another terminal of the selector 1.

The first example of the present invention is described below in further detail, in which elements that are same as in the prior art example are assigned the same reference numerals and are not explicitly described.

In FIG. 1, the timer counter 10 performs counting operations in synchronization with the counting clock signal CK, the read buffer 20 capturing the value of the timer counter 10 in synchronization with the read clock signal RCK. The counting clock signal CK and the read strobe signal RDST are asynchronous.

As shown in FIG. 1(b), in synchronization with the rising edge of the counting clock signal CK, the timer counter 10 performs a counting operation. When the read strobe signal RDST is 0, that is, when a read signal is not output from the CPU, the flip-flop 2 captures the inverted output signal 2B of the flip-flop circuit 2, synchronous with the rising edge of the counting clock signal CK. Then, on the next rising edge of the counting clock signal CK, the flip-flop 3 shifts the output signal 2A of the flip-flop circuit 2, and at the exclusive-OR (EXOR) circuit 4, the exclusive OR of the output signal 2A of the flip-flop circuit 2 and the output signal 3A of the flip-flop circuit 3 is taken, therefore, when the read strobe signal RDST is 0, data of the timer counter 10 is captured into the read buffer 20, synchronized with the read clock signal RCK. The AND circuit 5 outputting the read clock signal RCK, and to which are input the output signal of the EXOR circuit 4 and the counting clock signal CK, is provided for the purpose of simulation, and is not related to the operation of the present invention.

In the case in which the read strobe signal is 1, however, the read clock signal RCK does not generate. When the read strobe signal is 1, that is, in the case in which a read signal has not been output from the CPU, the flip-flop circuit 2 captures the output signal 2A of the flip-flop circuit 2, synchronized to the rising edge of the counting clock signal CK. Therefore, the output signals of the flip-flop circuits 2 and 3 will both be either 0 or 1 (0 at the timing shown in FIG. 1), the result being that the output of the EXOR circuit 4 will be 0, so that the read clock signal RCK is not generated. As a result, the value of the read buffer 20 is not updated, and the read buffer 20 holds the data captured from the timer counter 10 when the read strobe signal RDST was 0.

A semiconductor integrated circuit and associated method for generating a control signal therefor adopt the above-described constitution, the result being that, when reading a timer counter value asynchronously with respect to the timer counter clock, it is possible to output a properly established read buffer value to the read data buffer. In particular, faulty operation does not occur even in the case in which the period of the read strobe signal RDST is shorter than that of one clock CK.

What is claimed is:

1. A semiconductor integrated circuit in which data of a logic circuit which operates by an internal clock signal is read into a read buffer, using a readout clock signal that is not synchronized to said internal clock signal, comprising:

a selector, which selects either an inverted signal or a non-inverted signal, based on a condition of a read strobe signal that gives an instruction for readout of data in said logic circuit into said read buffer, a first flip-flop circuit, which latches a signal selected by said selector at a timing of said internal clock signal, and outputs a latched signal to said selector, a second flip-flop circuit, which shifts an output signal of said first flip-flop circuit at a timing of said internal clock signal, and an exclusive-OR circuit, which takes an exclusive OR of said output signal of said first flip-flop circuit and an output signal of said second flip-flop circuit, an output signal of said exclusive-OR circuit serves as said readout clock signal of said read buffer.

2. A semiconductor integrated circuit according to claim 1, said output signal of said first flip-flop circuit is input to one terminal of said selector, and an inverted signal of said output signal of said first flip-flop circuit is input to another terminal of said selector.

3. A control signal generating method for a semiconductor integrated circuit in which data of a logic circuit which operates by an internal clock signal is read into a read buffer, using a readout clock signal that is not synchronized to said internal clock signal, comprising:

a first step of generating a pulse signal that is synchronous with said internal clock signal, when a read strobe signal is not giving an instruction for readout of data in said logic circuit to said read buffer, and of stopping to generate said pulse signal, when said read strobe signal gives an instruction for readout, a second step of shifting said pulse signal generated by said first step by one clock, in synchronization with said internal clock signal, and a third step of taking an exclusive OR of said signal generated by said first step and a signal generated by said second step, and using a resulting signal as said readout clock signal.

* * * * *